United States Patent
Sumi et al.

(10) Patent No.: US 6,859,231 B1
(45) Date of Patent: Feb. 22, 2005

(54) DRIVE CONTROL METHOD FOR PHOTOSENSOR SYSTEM

(75) Inventors: Shinobu Sumi, Tama (JP); Yoshiaki Nakamura, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/539,210

(22) Filed: Mar. 30, 2000

(30) Foreign Application Priority Data

Apr. 9, 1999 (JP) .......................................... 11-103413
Sep. 6, 1999 (JP) .......................................... 11-252108

(51) Int. Cl.$^7$ ............................................. H04N 5/335
(52) U.S. Cl. ...................................... 348/302; 348/312
(58) Field of Search ................................ 348/302, 312

(56) References Cited

U.S. PATENT DOCUMENTS

| | | | |
|---|---|---|---|
| 4,603,355 A | 7/1986 | Yamada et al. | |
| 4,870,493 A * | 9/1989 | Izawa et al. | 348/305 |
| 5,461,419 A * | 10/1995 | Yamada | 348/302 |
| 5,583,570 A | 12/1996 | Yamada | |
| 5,780,858 A | 7/1998 | Waechter et al. | |
| 6,429,898 B1 * | 8/2002 | Shoda et al. | 348/316 |

* cited by examiner

*Primary Examiner*—Tuan Ho
*Assistant Examiner*—Heather R Long
(74) *Attorney, Agent, or Firm*—Frishauf, Holtz, Goodman & Chick, P.C.

(57) ABSTRACT

In a photosensor system formed of a photosensor array including a plurality of photosensors arranged in a two dimensional direction, the intervals of the reset pulse, read pulse and pre-charge pulse applied to each row of the photosensor array are respectively set equal to the sum of the reset period, the read period, and the pre-charge period. It follows that even where the read processing time of a single screen is shortened by allowing the processing cycles for the rows to partially overlap with each other, the reset period, the pre-charge period and the read period are prevented from being overlapped in time with each other, making it possible to perform the read operation accurately.

12 Claims, 9 Drawing Sheets

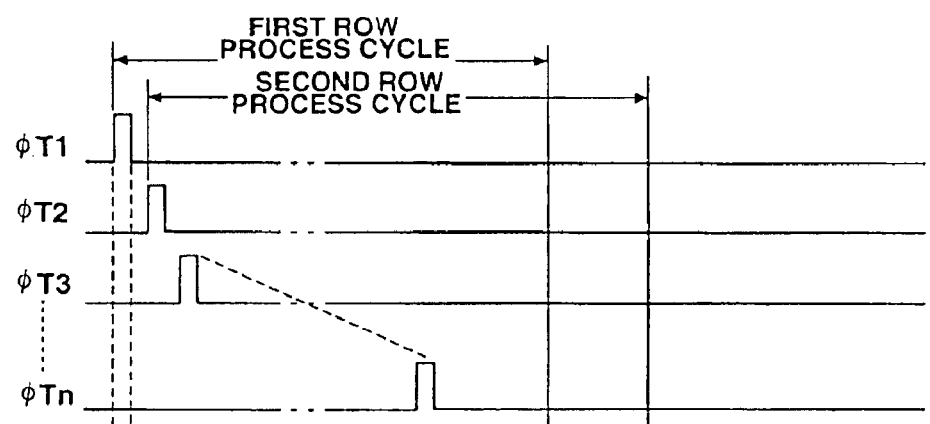
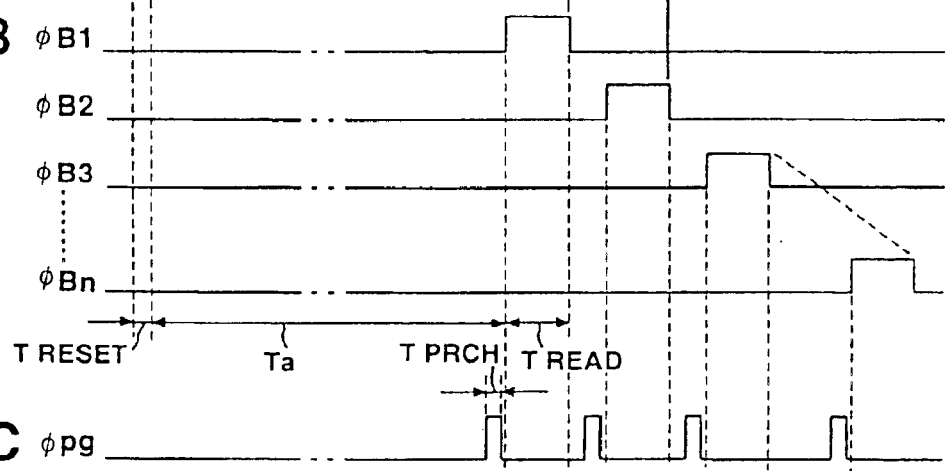

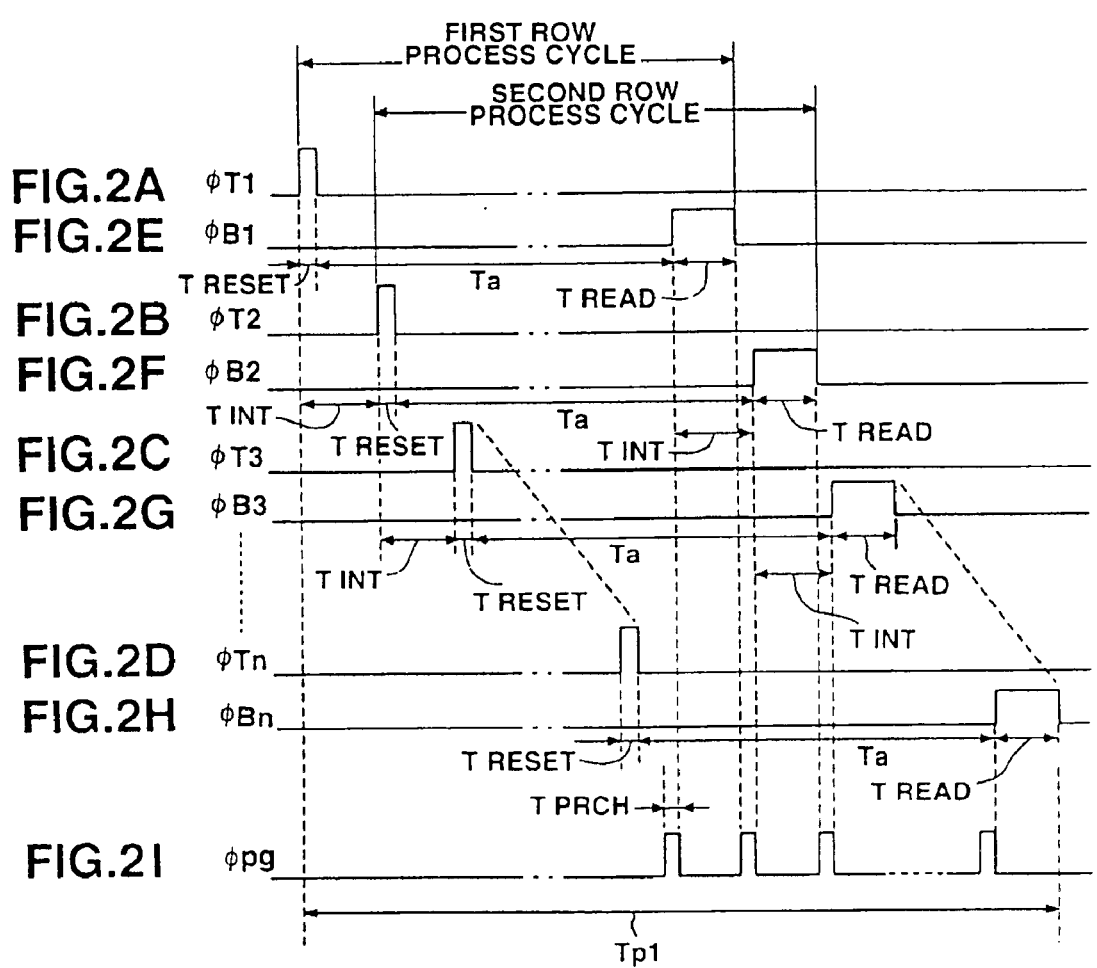

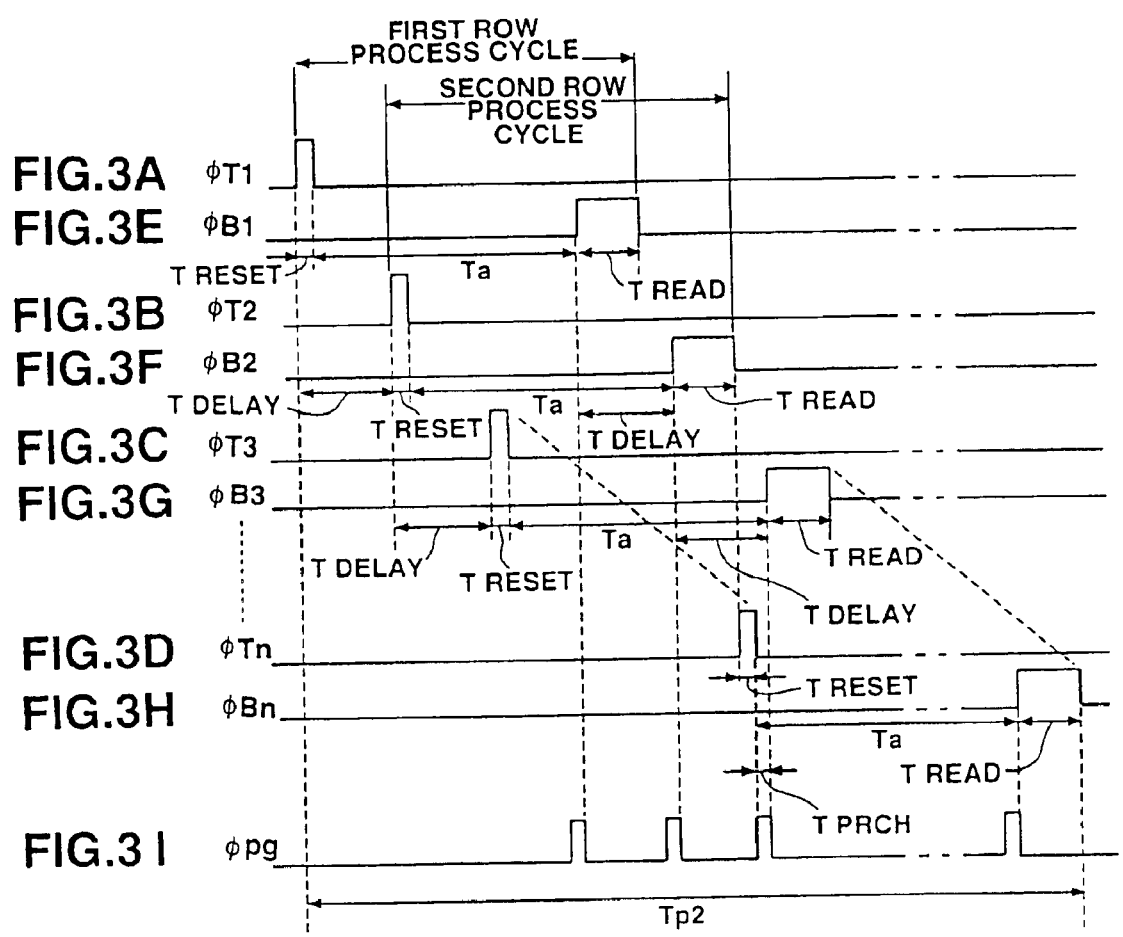

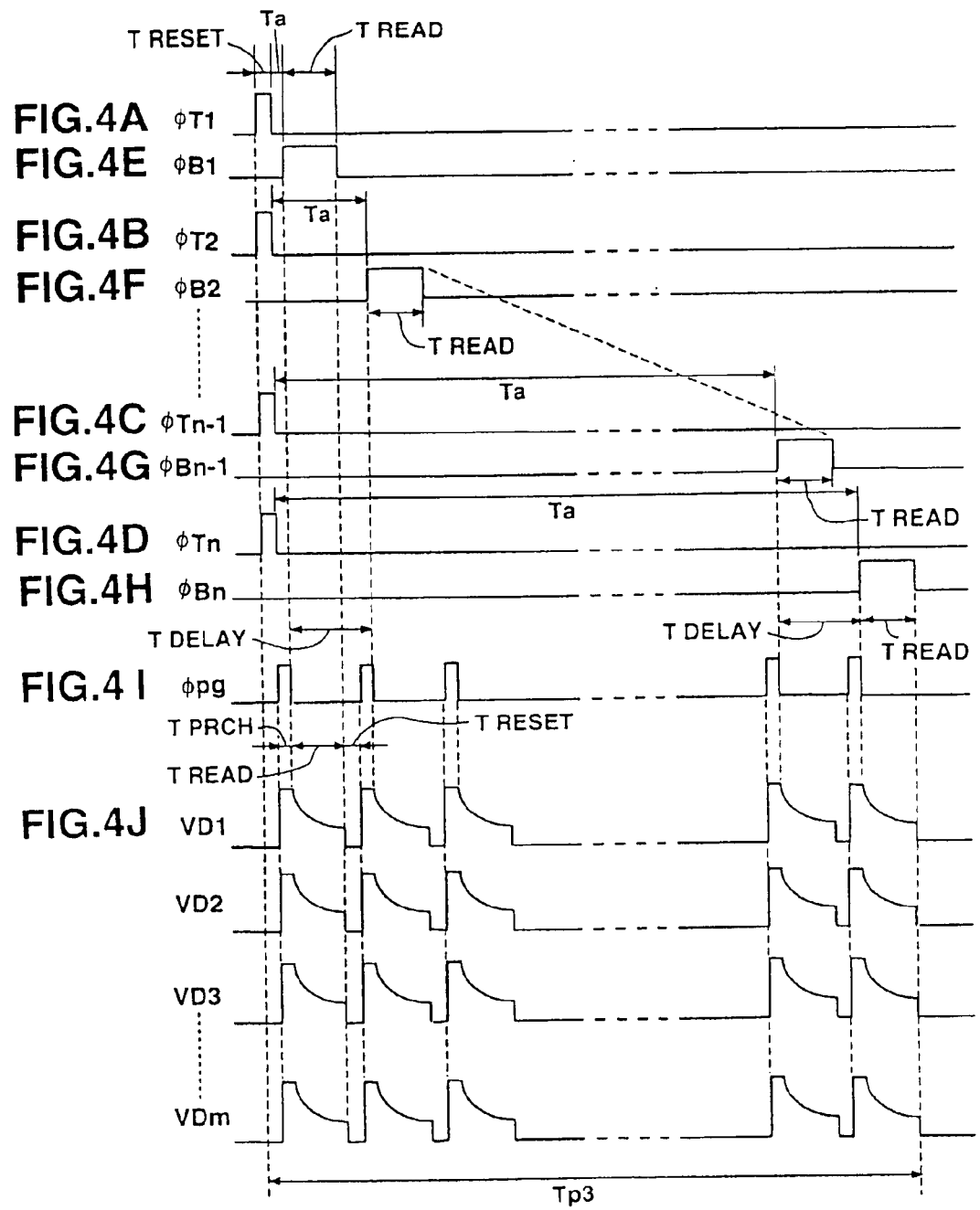

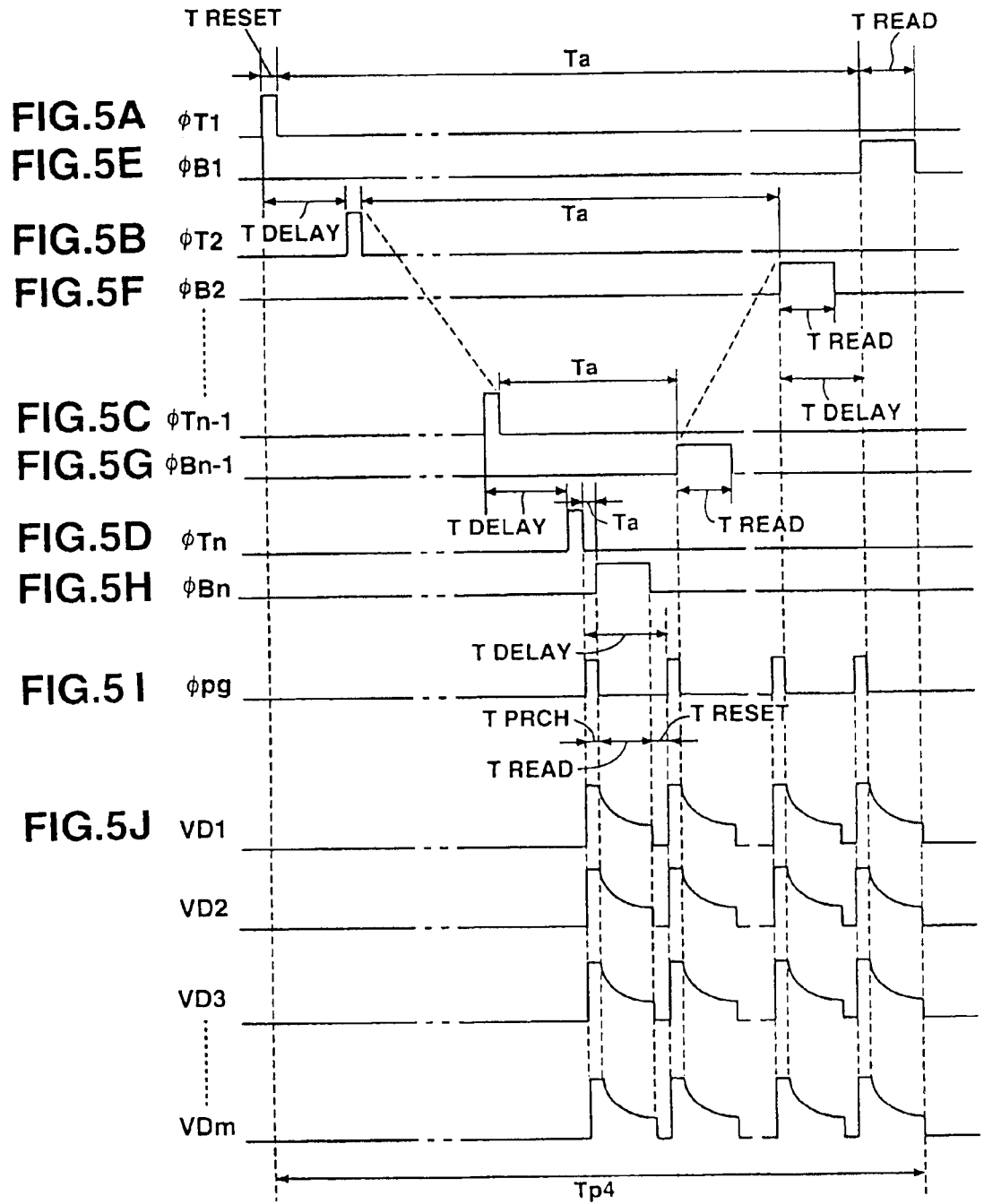

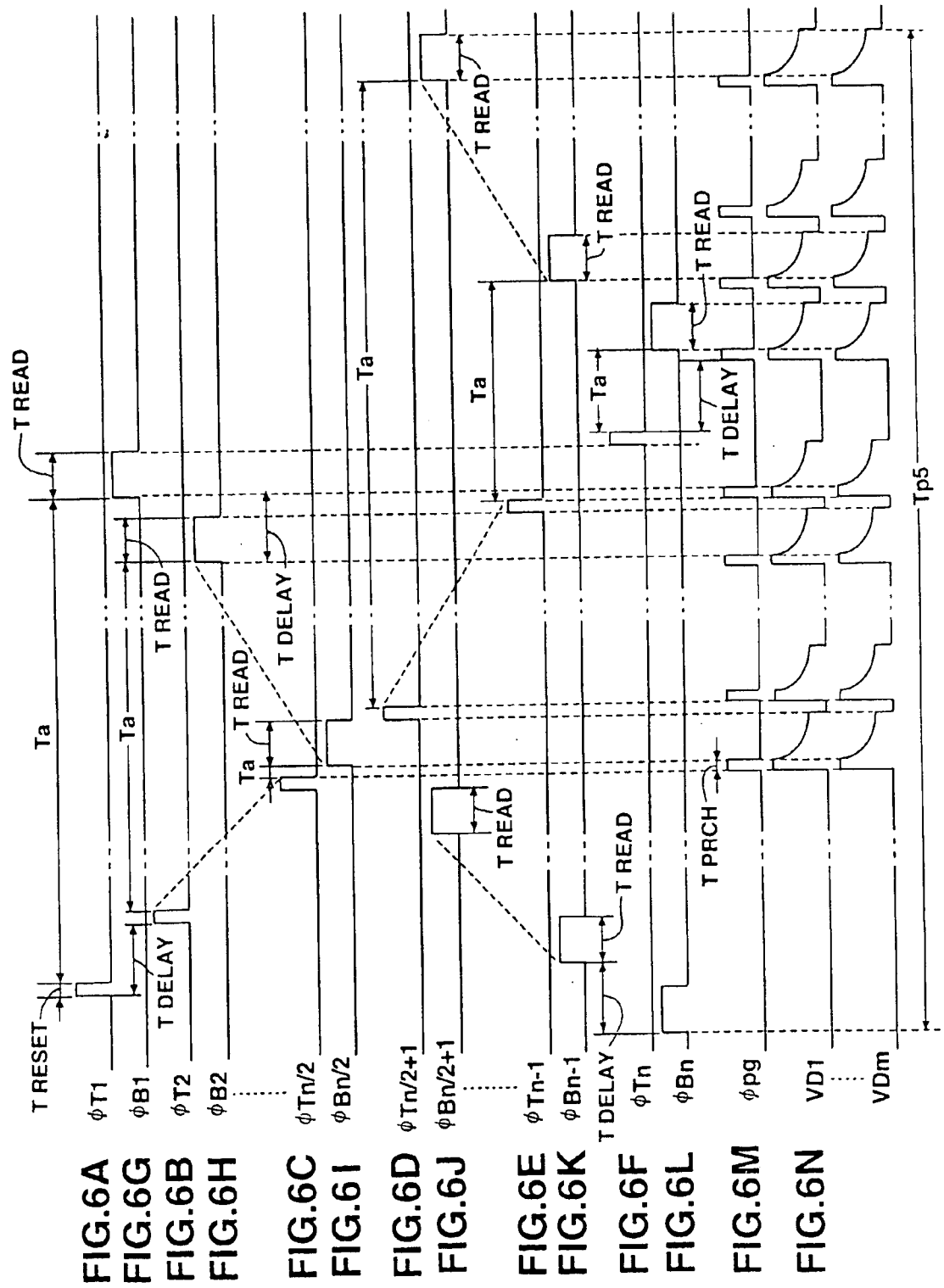

PRIOR ART

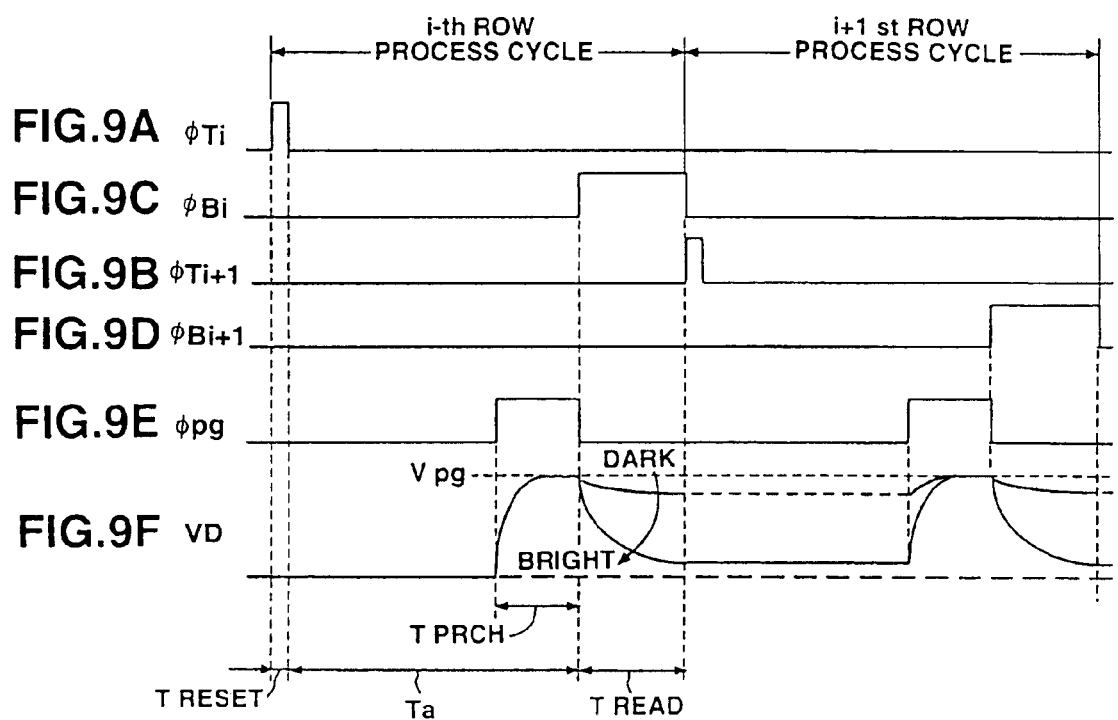

DRIVE CONTROL METHOD FOR PHOTOSENSOR SYSTEM

CROSS-REFERENCE TO RELATED APPLICATIONS

This application is based upon and claims the benefit of priority from the prior Japanese Patent Applications No. 11-103413, filed Apr. 9, 1999; and No. 11-252108, filed Sep. 6, 1999, the entire contents of which are incorporated herein by reference.

BACKGROUND OF THE INVENTION

The present invention relates to a drive control method for a photosensor array including a plurality of photosensors arranged in a two-dimensional direction.

In recent years, pickup devices such as an electronic still camera and a video camera have been prominently propagated. In such a pickup device, a solid state pickup device such as a CCD (Charge Coupled Device) is used as a photovoltaic device for converting the subject image into image signals. As known to the art, a CCD is constructed photosensors (light receiving elements) such as photodiodes and TFTs (Thin Film Transistors) that are arranged to form a matrix. The amount of electron-hole pairs (amount of charge) generated in accordance with the amount of light illuminating the light receiving portion of each photosensor is detected by a horizontal scanning circuit and a vertical scanning circuit so as to detect the brightness of the illuminating light.

In a photosensor system using such a CCD, it was necessary to arrange separately a selecting transistor for putting a scanned photosensor in a selected state. On the other hand, the present inventors have previously developed a photosensor (double gate type photosensor) constructed by a thin film transistor having a so-called "double gate" structure, in which the photosensor itself is enabled to perform the photosensing function and the selecting function.

FIG. 7A is a cross sectional view showing the construction of such a double gate type photosensor 10. As shown in the figure, the double gate type photosensor 10 comprises a semiconductor thin film 11 made of, for example, an amorphous silicon, n$^+$-type silicon layers 17, 18 formed on both edge portions of the semiconductor thin film 11, a source electrode 12 and a drain electrode 13 formed on the n$^+$-type silicon layers 17 and 18, respectively, a top gate electrode 21 formed above the semiconductor thin film 11 with a block insulating film 14 and an upper gate insulating film 15 interposed therebetween, a protective insulating film 20 formed on the top electrode 21, and a bottom gate electrode 22 formed below the semi-conductor thin film 11 with a lower gate insulating film 16 interposed therebetween. The bottom gate electrode 22 is formed on a transparent insulating substrate 19 such as a glass substrate.

In other words, the double gate type photosensor 10 comprises an upper MOS transistor including the semiconductor thin film 11, the source electrode 12, the drain electrode 13, and the top gate electrode 21, and a lower MOS transistor having the semiconductor thin film 11, the source electrode 12, the drain electrode 13, and the bottom gate electrode 22. As apparent from the equivalent circuit diagram as shown in FIG. 7B, it is reasonable to understand that two MOS transistors having the semiconductor thin film 11 as a common channel region, a TG (top gate electrode), a BG (bottom gate electrode), an S (source terminal) and a D (drain terminal) are combined to form the double gate type photosensor 10.

Each of the protective insulating film 20, the top gate electrode 21, the upper gate insulating film 15, the block insulating film 14 and the lower gate insulating film 16 is formed of a material having a high transmittance of a visible light exciting the semiconductor layer 11. The light incident from the top gate electrode 21 is transmitted through the top gate electrode 21, the upper gate insulating film 15, and the block insulating film 14 so as to be incident on the semiconductor thin film 11, with the result that charges (holes) are generated and accumulated in the channel region.

FIG. 8 schematically shows the construction of the photosensor system including the double gate type photosensors 10 in a two dimensional direction. As shown in the figure, the photosensor system comprises a sensor array 100 formed by arranging a large number of double gate type photosensors 10 to form a matrix consisting of an n-number of rows and an m-number of columns, a top gate line 101 and a bottom gate line 102 consisting, respectively, of the top gates TG and the bottom gates BT of the double gate type photosensors 10 that are connected to each other in the row direction of the matrix, a top gate driver 111 and a bottom gate driver 112 connected, respectively, to the top gate line 101 and the bottom gate line 102, a data line 103 consisting of the drain terminals D of the double gate type photosensors 10 that are connected to each other in the column direction of the matrix, and a column switch 113 connected to the data lines 103.

Symbols Vtg and Vbg shown in this figure represent the reference voltages for generating a reset pulse φTi and a read pulse φBi, respectively, which are described hereinlater, and a symbol φpg represents a pre-charge pulse for controlling the timing for applying a pre-charge voltage Vpg.

In the construction described above, the photosensing function is performed by applying a predetermined voltage from the top gate driver 111 to the top gate terminal TG, and the reading function is performed by applying a predetermined voltage from the bottom gate driver 112 to the bottom gate terminal BG so as to supply the output voltage of the photosensor 10 to the column switch 113 through the data line 103 and, thus, to produce a serial data Vout as the output signal.

FIGS. 9A to 9F are timing charts showing the drive control method of the photosensor system. In the first step, a reset pulse φTi shown in FIG. 9A is applied to the top gate line 101 in an i-th column during the detecting operation period (processing cycle in the i-th column) in the i-th row so as to perform a reset operation for releasing the charges accumulated in the double gate type photosensor 10 in the i-th row during the reset period Treset.

After completion of the reset period Treset, a charge accumulating period Ta is started by the charge accumulating function in the channel region. During the charge accumulating period Ta, charges (holes) are accumulated in the channel region in accordance with the amount of light incident from the side of the top gate electrode.

A pre-charge period Tprch, in which the pre-charge pulse φpg shown in FIG. 9E, which has a pre-charge voltage Vpg, is applied to the data line 103 so as to permit the drain electrode to retain the charge, is provided in parallel to the charge accumulating period Ta. After the pre-charge period Tprch, a read pulse φBi shown in FIG. 9C is applied to the bottom gate line 102 so as to turn on the double gate type photosensor 10, thereby starting a read period Tread.

During the read period Tread, the charges accumulated in the channel region serve to moderate the voltage (low level)

applied to the top gate terminal TG of the opposite polarity. As a result, an n-channel is formed by the voltage Vbg of the bottom gate terminal BG, and the voltage VD of the data line 103 tends to be gradually lowered with time from the pre-charge voltage Vpg in accordance with the drain current. In other words, the tendency in the change of the voltage VD of the data line 103 depends on the charge accumulating period Ta and the amount of the received light. To be more specific, the voltage VD tends to be lowered moderately in the case where the incident light is dark and the light amount is small so as to decrease the amount of the accumulated charge. On the other hand, the voltage VD tends to be lowered rapidly in the case where the incident light is bright and the light amount is large so as to increase the amount of the accumulated charges. It follows that the amount of the illuminating light is calculated by detecting the voltage VD of the data line 103 a predetermined time after the starting of the read period Tread or by detecting the time required for reaching the particular voltage based on a predetermined threshold voltage.

In the detecting operation period in the succeeding i+1st row (i+1st row processing cycle), the reset pulse φTi+1 shown in FIG. 9B and the read pulse φBi+1 shown in FIG. 9D are applied as in the operation for the i-th row for performing the reading operation. Such an operation is performed for each row of the sensor array 100.

The operation described above covers the case where a double gate type photosensor is used as the photosensor. However, the photosensor system using photodiodes or phototransistors also has the operating steps of reset operation→pre-charge operation→read operation and, thus, follows the similar drive procedures.

However, the conventional photosensor system described above gives rise to problems as pointed out below:

(1) Where the image of a subject is read by using a photosensor array having a plurality of photosensors arranged to form a matrix in two dimensional directions, it was customary to employ a drive control method that a series of processing procedures are performed such that reset pulses and pre-charge pulses are applied to the photosensors for every row of the matrix, followed by applying read pulses the charge accumulating period Ta later, and that the particular procedure is repeated for every row.

As a result, when it comes to a two dimensional matrix having an n-number of rows, the similar operations must be repeatedly performed n-number of times starting with the first row and ending in the last n-th row in order to perform the scanning operation over the entire region of a single screen. In other words, the processing time (scanning time) over the entire region of a single screen is increased with increase in the number of rows of the two dimensional sensor array. As a result, a restriction is generated that the subject must be kept stationary until completion of the scanning operation over the entire region of the single screen. It follows that the practical use of the photosensor array is very much limited.

(2) In the photosensor system using the photosensor of the type that the charges generated by the incident light are accumulated during the charge accumulating period like the double gate type photosensor described above, the charge accumulating period must be set long for obtaining a sufficient detection sensitivity in the case where the subject is dark and, thus, the charges are accumulated in a small amount. On the other hand, the charge accumulating period must be set short to prevent the charges from being saturated in the case where the subject is bright and, thus, the charges are accumulated in a large amount. In other words, in order to read an image of the subject with a suitable sensitivity, it is necessary to set appropriately the sensitivity of the photosensor in accordance with the brightness of the subject. Therefore, where the site in which the photosensor system is used, and the subject itself are changed in various fashions, the brightness of the subject is changed in various fashions depending on the environmental conditions and the kind of the subject. Under the circumstances, it is necessary to perform a trial read operation (or preparatory read operation) immediately before the normal read operation of the subject image so as to obtain a suitable sensitivity. Where the preparatory read operation is performed by the conventional drive control method, the entire screen is read by setting the sensitivity at a suitable value and, if the result of detection is inappropriate, the entire screen is read again by changing the sensitivity. The particular operation is repeated a plurality of times so as to find a set value of sensitivity that permits obtaining an appropriate result of detection. Naturally, the preparatory read operation takes a very long time, giving rise to the problem that it is impossible to start the read operation of the image of the subject promptly with an appropriate sensitivity.

BRIEF SUMMARY OF THE INVENTION

An object of the present invention is to provide a drive control method that permits shortening the time required for the read operation of an image of a subject in a photosensor system including a plurality of photosensors arranged to form a two dimensional array.

Another object of the present invention is to provide a drive control method of a photosensor system that permits promptly executing the read operation of an image of a subject with a detecting sensitivity adapted for the state of use.

A first drive control method of the present invention for achieving the objects noted above is directed to a drive control method for shortening the time required for a read processing of an image of a subject. Specifically, while performing the reset operation in advance by successively applying reset pulses to each row, read pulses are successively applied to the row having a pre-charge pulse applied thereto to finish the pre-charge operation after the charge accumulating period so as to read the output voltage of the photosensor. What should be noted is that the processing cycles for the rows are allowed to overlap in time with each other so as to shorten the read processing time of a single screen. The particular drive control method is characterized in that the interval of the reset pulse, read pulse and pre-charge pulse for each row is set equal to the sum of the reset period performed by the reset pulse, the read period performed by the read pulse, and the pre-charge period performed by the pre-charge pulse. As a result, the reset period, the pre-charge period, and the read period for each row are prevented from overlapping in time with each other, making it possible to perform an accurate read operation while preventing the output voltages for the rows from being mutually affected each other. Also, since it is possible to start the read operation by applying the pre-charge pulse and the read pulse before completion of the reset operation for all the rows, it is possible to set the charge accumulating period, i.e., the sensitivity of the photosensor, over a wide range.

The second drive control method of the present invention for achieving the objects noted above is directed to a drive control method that permits promptly executing a read operation of an image of a subject based on the detection sensitivity adapted for the state of use. To be more specific, in the drive control method in which the processing cycles for each row are allowed to overlap in time partially with each other as in the first drive control method described above, the reset pulses are applied simultaneously or successively to the rows for the reset, and the charge accumulating periods for the rows are made different from each other by a period of time equal to an integer number times as much as the total time, i.e., sum, of the reset period, the read period and the pre-charge period. Under this condition, the pre-charge pulses and the read pulses are successively applied to the rows at the timing that the pre-charge period and the read period for each row do not overlap in time with each other so as to perform the read processing. As a result, the charge accumulating period for each row assumes a value differing in an amount equal to the number of rows at the interval an integer number of times as much as the total time noted above, making it possible to obtain an image read with a detection sensitivity differing in an amount equal to the number of rows by the read processing of a single screen. Since it is possible to extract the value of the optimum detection sensitivity that permits the best detection by using the image data obtained by the read processing of a single screen, it is possible to shorten markedly the process time for reading an image, which is required for setting the optimum detection sensitivity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are timing charts showing the concept of a drive control method for a photosensor system according to the present invention;

FIGS. 2A to 2I are timing charts showing the timings of the processing operation for each row according to a first embodiment of the drive control method for a photosensor system, of the present invention;

FIGS. 3A to 3I are timing charts showing the timings of the processing operation for each row according to a second embodiment of the drive control method for a photosensor system, of the present invention;

FIGS. 4A to 4J are timing charts showing the timings of the processing operation for each row according to a third embodiment of the drive control method for a photosensor system, of the present invention;

FIGS. 5A to 5J are timing charts showing the timings of the processing operation for each row according to a fourth embodiment of the drive control method for a photosensor system, of the present invention;

FIGS. 6A to 6N are timing charts showing the timings of the processing operation for each row according to a fifth embodiment of the drive control method for a photosensor system, of the present invention;

FIG. 9A to 9F are timing charts showing the conventional drive control method for a photosensor system.

DETAILED DESCRIPTION OF THE INVENTION

The drive control method for a photosensor system of the present invention will now be described in detail on the basis of the embodiments shown in the accompanying drawings. In each of the embodiments described in the following, the double gate type photosensors are used for forming the photosensor system. However, the present invention is not limited to the use of the double gate type photosensor. In other words, a photosensor of another construction can also be used in the photosensor system of the present invention.

Figure 7A:
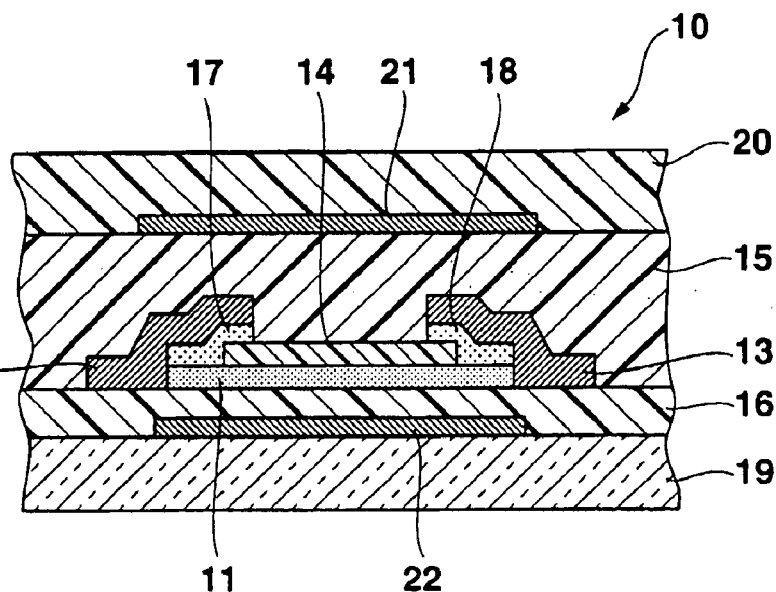
FIG. 7A is a cross sectional view showing the construction of a double gate type photosensor.
Figure 7B:
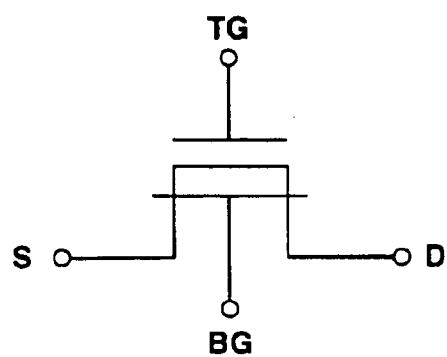
FIG. 7B is an equivalent circuit diagram of the double gate type photosensor.
Figure 8:
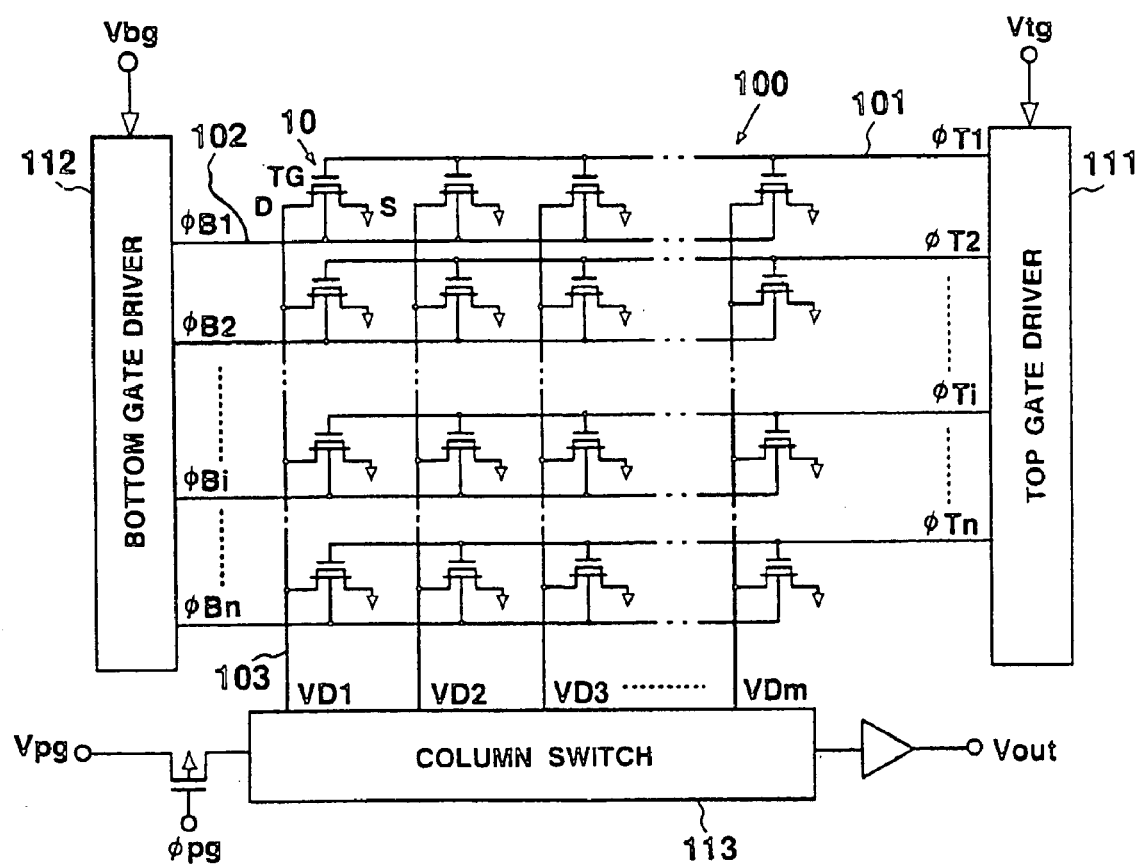
FIG. 8 shows the construction of a photosensor system prepared by arranging a plurality of double gate type photosensors in a two dimensional direction.

The constituent of the photosensor system in each of the embodiments described below is equal to that of the conventional photosensor system provided with an n-number of rows of the photosensor array 100 shown in FIG. 8. Thus, the construction of the photosensor system shown in FIG. 8 will be referred to, as required, in the following description of the embodiments of the present invention.

FIGS. 1A to 1C are timing charts showing the concept of the drive control method for a photosensor array according to the present invention.

In the drive control method, reset pulses $\phi T1$, $\phi T2$, $\phi T3$ ... $\phi Tn$ shown in FIG. 1A are applied successively to the top gate lines 101 connecting the top gate terminals TG of a plurality of double gate type photosensors 10 in the row direction so as to start the reset period Treset and, thus, to initialize the double gate type photosensors 10 for each row.

When the reset pulses $\phi T1$, $\phi T2$, $\phi T3$, ... $\phi Tn$ successively fall down to the lower level so as to successively terminate the reset period Treset, the charge accumulating periods Ta are successively started, with the result that charges (holes) are generated in the channel region in accordance with the amount of light incident from the top gate electrode side of the double gate photosensors 10 for each row so as to be accumulated.

Then, the pre-charge pulses $\phi pg$ shown in FIG. 1C are applied to all the data line 103 during the charge accumulating period Ta so as to start the pre-charge period Tprch, thereby performing the pre-charge operation for allowing the drain electrode of the double gate type photosensor 10 to retain a predetermined voltage.

In the next step, read pulses $\phi B1$, $\phi B2$, $\phi B3$, $\phi Bn$ shown in FIG. 1B are successively applied to the photosensors 10 after the charge accumulating period Ta and after the pre-charge period Tprch through the bottom gate lines 102 so as to start the read period Tread. As a result, the change in the voltage corresponding to the charge accumulated in each of the double gate type photosensors 10 is taken into the column switch 113 through the data line 103 so as to read the change in the voltage. For detecting the amount of the irradiating light, the tendency of the voltage drop of the data line 103 is detected by detecting the voltage value a predetermined period of time after the start of the read period Tread or by detecting the time required for reaching the voltage value based on a predetermined threshold voltage so as to calculate the amount of the irradiating light, as in the prior art.

In the drive control method of the prior art, a series of operations including the reset operation, the charge accumulating operation and the read operation are executed within a read processing period for each row of the photosensor array 100, and these procedures are repeated for each row. In the drive control method of the present invention, however, the timings of applying the pre-charge pulse φpg and the read pulses φB1, φB2, φB3, . . . φBn for each row are set not to overlap with each other. As a result, the charge accumulating period Ta during the read processing period for each row is allowed to overlap partially in time. It follows that even where the entire read processing time is shortened by allowing the processing cycles for the rows to partially overlap with each other, the output voltages for the rows are not mutually affected with each other, making it possible to perform the read operation accurately.

<First Embodiment>

FIGS. 2A to 2I are timing charts showing the timings of the processing operation for each row in the drive control method for a photosensor according to a first embodiment of the present invention.

In general, the read period Tread is set longer than the reset period Treset in a photosensor system in order to improve the detection sensitivity of the light amount. Also, the charge accumulating period Ta for each row corresponding to the detection sensitivity is set at a constant value in order to facilitate the drive control and the processing of the detected results. It follows that, where reset operations for each row are performed continuously, it is possible for the charge accumulating period Ta of the double gate type photosensor 10 for a second row to lapse away during the read period Tread after the charge accumulating period Ta of the double gate type photosensor 10 of a first row, with the result that the read periods Tread of different rows to overlap with each other. As a result, the read data corresponding to different rows are simultaneously outputted to a single data line 103, giving rise to crosstalk of data and, thus, making it impossible to read data accurately. Also, since it is absolutely necessary to arrange the pre-charge period Tprch before the read period Tread for each row, it is possible for the read period Tread to overlap in time with the pre-charge period Tprch, making it impossible to read data accurately.

Such being the situation, the first embodiment of the present invention is directed to the drive control method in which the read pulses φB1, φB2, φB3, . . . φBn are successively applied to the double gate type photosensors 10 through the bottom gate line 102 starting with the double gate type photosensors 10 on the first row after the charge accumulating period and after completion of the pre-charge operation while executing in advance the reset operation for successively applying the reset pulses φT1, φT2, φT3, . . . φTn as in the operating procedure shown in FIGS. 1A to 1C so as to execute the processing procedure for reading the change in voltage of the drain electrode, thereby allowing parts of the processing cycles for each row to overlap in time with each other. What should be noted is that, in the first embodiment, the respective intervals of the reset pulses φT1, φT2, φT3, . . . φTn shown in FIGS. 2A to 2D, the read pulses φB1, φB2, φB3, . . . φBn shown in FIGS. 2E to 2H, and the pre-charge pulse φpg shown in FIG. 2I are set to be equal to the sum of the read period Tread using the read pulses and the pre-charge period Tprch using the pre-charge pulses. In other words, the intervals of the reset pulses for each row, the read pulses for each row and the pre-charge pulse respectively constitute a first pulse interval Tint represented by formula (1) given below:

$$Tint = Tprch + Tread \quad (1)$$

In this case, it is possible to prevent the read periods Tread of the double gate type photosensors 10 for each row, the pre-charge period Tprch applied to the data line, and the read period Tread from overlapping in time with each other, making it possible to prevent the output voltages for each row from being affected each other to generate crosstalk. It follows that it is possible to perform the read operation accurately. In this case, however, it is impossible to set the charge accumulating period Ta at an optional time, and the set period of the charge accumulating period Ta is the time in which the first pulse interval Tint forms a unit.

It should also be noted that the particular construction of the first embodiment makes it possible to markedly shorten the operation processing time as described below. Further, since the read period Tread is set constant and the interval between adjacent reset operations, which is equal to the sum of the read period Tread and the pre-charge period Tprch, is also set constant, the drive control can be simplified.

The shortening of the operation processing time achieved by the drive control method of the first embodiment will now be described. Where the number of rows of the photosensor array 100 is n, the scanning time over the entire photosensor array (over the entire screen) in the conventional technology is Tp_old shown in formula (2) because the processing time for a single row consisting of the total time of the reset period Treset, the charge accumulating period Ta and the read period Tread is repeated for n-number of rows as shown in FIGS. 9A to 9F. On the other hand, the scan time Tp1 in the first embodiment can be represented as denoted by formula (3) because the scan time Tp1 is equal to the sum of the reset period Treset for the first row, the charge accumulating period Ta and the read period Tread after the read period Tread and the pre-charge period Tprch are consecutively repeated n-1 times, as shown in FIGS. 2A to 2I. It follows that the difference between the scan time Tp_old in the prior art and the scan time Tp1 in the first embodiment, i.e., the operation processing time shortened by the first embodiment, is Toff as shown in formula (4):

$$Tp\_old = n \times (Treset + Ta + Tread) \quad (2)$$

$$Tp1 = Treset + Ta + (n-1) \times (Tread + Tprch) + Tread \quad (3)$$
$$= Treset + Ta + n \times (Tread + Tprch) - Tprch$$

$$Toff = Tp\_old - Tp1 = (n-1) \times (Treset + Ta - Tprch) \quad (4)$$

It should be noted that, where the brightness of the light received by the double gate type photosensor is, for example, scores of luxes, about 0.15 second of the processing time is required for a single row (scanning line). It follows that, where the number n of rows is about 200, about 30 seconds of scanning time is required in the prior art. In the first embodiment of the present invention, however, the scanning time can be set at about 0.3 second. It follows that the shortened processing time Toff is about 29.7 seconds. In other words, the first embodiment permits markedly shortening the scan processing time to 1/100 the scan processing time for the prior art.

<Second Embodiment>

FIGS. 3A to 3I are timing charts showing the timings of the processing operation for each row in the drive control method for a photosensor according to a second embodiment of the present invention.

The first embodiment of the present invention is directed to the drive control method in which the read pulses φB1, φB2, φB3, . . . φBn are successively applied to the double gate type photosensors 10 through the bottom gate lines 102 starting with the double gate type photosensors 10 on the first row after the charge accumulating period and after completion of the pre-charge operation while executing in advance the reset operation for successively applying the reset pulses φT1, φT2, φT3, . . . φTn as in the operating procedure shown in FIGS. 1A to 1C so as to execute the processing procedure for reading the change in voltage of the drain electrode, thereby allowing parts of the processing cycles for each row to overlap in time with each other. What should be noted is that, in the second embodiment, the interval among the reset pulses φT1, φT2, φT3, . . . φTn shown in FIGS. 3A to 3D, the read pulses φB1, φB2, φB3, . . . φBn shown in FIGS. 3E to 3H, and the pre-charge pulse φpg shown in FIG. 3I is set to be equal to the sum of the reset period Treset using the reset pulses, the read period Tread using the read pulses and the pre-charge period Tprch using the pre-charge pulses. In other words, the interval among the reset pulses, the read pulses and the pre-charge pulse constitutes a second pulse interval Tdelay represented by formula (5) given below:

$$Tdelay = Treset + Tprch + Tread \qquad (5)$$

The second embodiment produces an advantage over the first embodiment as described below. Specifically, in the first embodiment, the interval among the reset pulse, the read pulse and the pre-charge pulse is set at the first pulse interval Tint, which is equal to the sum of the read period Tread and the pre-charge period Tprch, so as to prevent the read period for each row and the pre-charge period from overlapping in time with each other. However, if the charge accumulating period Ta is shortened so as to start the reading operation before completion of the reset operation for all the rows, it is possible for the reset period Treset for each row to overlap in time with the pre-charge period Tprch or with the read period Tread, making it impossible to perform reading accurately. Therefore, in the first embodiment, it is necessary to start the pre-charge operation and the read operation after completion of the reset operation for all the rows. This brings about a problem that it is impossible to make the charge accumulating period Ta shorter than the time for completing the reset operation for all the rows.

In the second embodiment, however, the interval among the reset pulse, the read pulse and the pre-charge pulse is set at the second pulse interval Tdelay represented by formula (5). As a result, even if the pre-charge operation and the read operation for each row are executed during the period between adjacent reset operations for each row, these pre-charge operation and read operation are prevented from overlapping in time with each other. In other words, it is possible to start the read operation before completion of the reset operation for all the rows so as to make the charge accumulating period Ta shorter than the time for completion of the reset operation for all the rows. It follows that it is possible to increase the width in which the charge accumulating period Ta can be set so as to increase the width in which the sensitivity can be set. In this case, however, it is impossible to set the charge accumulating period Ta in an optional time, and the period Ta is as represented by formula (6) given below, in which k is an integer of 0 or more. As apparent from formula (6), the set period of the charge accumulating period Ta is time in which the second pulse interval Tdelay constitutes a unit.

$$Ta = Tdelay \times k + Tprch \qquad (6)$$

The scan time Tp2 in the second embodiment is equal to the sum of the reset period Treset for the first row, the charge accumulating Ta, and the read period Tread after the read period Tread and the pre-charge period Tprch are repeated at the second pulse interval Tdelay n−1 times. Therefore, the scan time Tp2 can be represented by formula (7) as follows:

$$\begin{aligned} Tp2 &= Treset + Ta + (n-1) \times (Treset + Tprch + Tread) + Tread \qquad (7) \\ &= Ta + n \times (Treset + Tprch + Tread) - Tprch \end{aligned}$$

Where the first and second embodiments are equal to each other in the charge accumulating period Ta, the operation interval for each row for the second embodiment is longer by the reset period Treset than that for the first embodiment and, thus, the scan time Tp2 for the second embodiment is also made longer than the scan time Tp1 for the first embodiment. In the second embodiment, however, the charge accumulating period Ta can be made shorter than that in the first embodiment. In this case, it is possible for the scan time Tp2 for the second embodiment to be made shorter than the scan time Tp1 for the first embodiment. At any rate, the scan time can be made markedly shorter than that in the prior art as in the first embodiment.

<Third Embodiment>

FIGS. 4A to 4J are timing charts showing the timings of the processing operation for each row in the drive control method for a photosensor according to a third embodiment of the present invention.

The third embodiment is directed to a drive control method in the processing (preparatory processing) for obtaining an optimum sensitivity set value that is changed in accordance with various conditions such as the brightness in the environment and the kind of the subject to be detected prior to the read operation (scanning operation) of the subject described in conjunction with the first and second embodiments of the present invention.

In the drive control method for the preparatory read processing according to the third embodiment of the present invention, the reset pulses φT1, φT2, φTn−1, φTn shown in FIGS. 4A to 4D are applied simultaneously to the top gate line 101 connecting the top gate terminals TG of the double gate type photosensors 10 in a row direction so as to initialize the double gate type photosensors 10 in all the rows.

These reset pulses φT1, φT2, . . . φTn−1, φTn are caused to simultaneously fall down to the lower level so as to terminate the reset period Treset. As a result, the charge accumulating period Ta of the double gate type photosensors 10 of all the rows are started simultaneously so as to permit the charges (holes) to be accumulated in the channel region in accordance with the amount of light incident from the side of the top gate electrodes of the double gate type photosensors 10 for each row.

Then, the charge accumulating period Ta is changed at the interval of the second pulse interval Tdelay for each row with the second pulse interval Tdelay shown in FIG. 5 forming a unit time so as to apply the pre-charge pulse φpg shown in FIG. 4I ad the read pulses φB1, φB2, φBn−1, φBn shown in FIGS. 4E to 4H to each row at the timing that the pre-charge period Tprch does not overlap in time with the read period Tread for each row. In other words, the pre-charge period Tprch is started by successively applying the pre-charge pulse φpg for every second pulse interval Tdelay within the charge accumulating period Ta, thereby performing the pre-charge operation in which the pre-charge voltage is applied to the data line 103 so as to allow the drain electrode of the double gate type photosensor 10 to retain a predetermined voltage. Then, the read pulses φB1, φB2, ... φBn−1, φBn are successively applied at the second pulse interval Tdelay to the double gate type photosensors 10 after the charge accumulating period Ta and the pre-charge period Tprch through the bottom gate line 102 so as to start the read period Tread. As a result, the changes in the voltages VD1, VD2, VD3 ... VDm conforming with the charge accumulated in each of the double gate type photosensors 10 are introduced into the column switch 113 through the data line 103 so as to be read out. Incidentally, as far as the third embodiment alone is concerned, it is possible to prevent the pre-charge period Tprch and the read period Tread from overlapping in time with each other even if the first pulse interval Tint given in formula (1), which is equal to the sum of the read period Tread and the pre-charge period Tprch, is employed in place of the second pulse interval Tdelay as the set interval of the charge accumulating period Ta. However, if the optimum charge accumulating period Ta obtained from the detection result of the third embodiment is applied to the charge accumulating period Ta in the read operation of the image of the normal subject and if the drive control method in the second embodiment is applied to the read operation, the set interval of the charge accumulating period Ta is equal to the value in which the second pulse interval Tdelay constitutes a unit. Therefore, if the set interval of the charge accumulating period Ta in the third embodiment is also equal to the second pulse interval Tdelay, it is possible to apply the value of the optimum charge accumulating period obtained in the third embodiment to the drive control method in the normal read operation. Therefore, the set interval of the charge accumulating period Ta in the third embodiment is made equal to the time of the second pulse interval Tdelay. This is also the case with each of fourth and fifth embodiments described herein later.

As described above, in the third embodiment, the charge accumulating period Ta is increased at a time interval of the second pulse interval Tdelay, making it possible to obtain an image read in a detection sensitivity differing in the stage of the number of rows by the preparatory read processing over an entire single screen. In other words, the charge accumulating period Ta for each row can be represented as denoted by formula (8) given below:

$$Ta = Tdelay \times J + Tprch \qquad (8)$$

where J is a variable consisting of an integer of 0 or more. The value of J is 0, 1, ... n−2, n−1 in the first to n-th rows. To be more specific, the charge accumulating period Ta is allowed to assume n-kinds of different values that are about integer number times as large as the second pulse interval Tdelay by the read operation over a single screen so as to execute the read processing by n-kinds of different sensitivities. Time Tp3 required for the reading of a single screen in the third embodiment is represented as denoted by formula (9), where n represents the number of rows of the array sensor 100:

$$Tp3 = [Tdelay \times (n-1) + Tprch] + Treset + Tread \qquad (9)$$
$$= Tdelay \times n = (Treset + Tprch + Tread) \times n$$

According to the drive control method of the third embodiment, the detection result for many kinds of sensitivities corresponding to the number of rows can be obtained by a single reading of a single screen, making it possible to obtain the value of the optimum detection sensitivity conforming with the change in the environmental condition and the change in the subject to be detected. It follows that the time required for the sensitivity adjustment can be markedly shortened.

In the drive control method of the third embodiment, it is necessary to apply the reset pulse to the double gate type photosensors of all the rows simultaneously. Thus, the top gate driver 111 is required to be provided with a sufficient driving capability fully meeting the necessity noted above.

In the example described above, the applying interval of the read pulse and the pre-charge pulse for each row is set at the time interval Tdelay. However, the time interval may be an integer number times as long as the interval Tdelay. Also, the applying interval for each row need not be constant. Specifically, it is possible for the applying interval to be different from a row to another row by the time an integer number of times as long as the interval Tdelay.

<Fourth Embodiment>

FIGS. 5A to 5J are timing charts showing the timings of the processing operation for each row in the drive control method for a photosensor according to a fourth embodiment of the present invention.

The fourth embodiment is directed to a drive control method in the preparatory processing like the third embodiment.

In the drive control method for the preparatory read processing according to the fourth embodiment of the present invention, the reset pulses φT1, φT2, φTn−1, φTn shown in FIGS. 5A to 5D are successively applied to the double gate type photosensors 10 through the top gate line 101 connecting the top gate terminals GT in the row direction starting with the first row at the second pulse interval Tdelay shown in formula (5) so as to start the reset period Treset and, thus, to initialize the double gate type photosensors 10 for each row.

When each of the reset pulses φT1, φT2, φTn−1, φTn falls down to the lower level so as to terminate the reset period Treset, the charge accumulating period Ta is started. As a result, charge (hole) is accumulated in the channel region in accordance with the amount of light incident from the top gate electrode side of the double gate type photosensors 10 for each row.

In the next step, after the reset pulse φTn for the last row (n-th row) falls down to the lower level, the charge accumulating period Ta is changed at the second pulse interval Tdelay for each row with the second pulse interval Tdelay shown in formula (5) used as a unit time, and the pre-charge pulse φpg shown in FIG. 5I and the read pulses φB1, φB2, ... φBn−1, φBn shown in FIGS. 5E to 5H are applied to each row starting with the n-th row to the first row at the timing that the pre-charge period Tprch and the read period Tread for each row do not overlap in time with each other. In other words, the pre-charge pulse φpg is successively applied for every second pulse interval Tdelay during the charge accumulating period Ta so as to start the pre-charge period Tprch, and the pre-charge voltage is applied to the data line 103 so as to perform the pre-charge operation in which the drain electrode of the double gate type photosensor 10 is allowed to retain a predetermined voltage. Then, the read pulses φBn, φBn−1, ... φB2, φB1 are successively applied to the photosensors 10 after the charge accumulating period Ta and the pre-charge period Tprch through each row from the n-th row to the first row of the bottom gate line 102 at the second pulse interval Tdelay so as to start the read period Tread starting with the n-th row. As a result, the changes in the voltage VD1, VD2, VD3, ... VDm accumulated in the double gate type photosensors 10, which are shown in FIG. 5J, are introduced into the column switch 113 through the data line 103 so as to be read out.

As described above, in the fourth embodiment, the charge accumulating period for each row is increased at the time interval twice as long as the second pulse interval Tdelay shown in FIG. 5. In other words, the charge accumulating period Ta for each row is represented as denoted by formula (10) given below:

$$Ta = 2 \times Tdelay \times L + Tprch \quad (10)$$

where L is a variable consisting of an integer of 0 or more. The value of L is 0, 1, . . . n−2, n−1 in the n-th to the first rows. To be more specific, the charge accumulating period Ta is allowed to assume n-kinds of different values that are an integer number times as long as twice the second pulse interval Tdelay by the read processing of a single screen so as to execute the read processing with n-kinds of different sensitivities. Time Tp4 required for the reading of the entire region of a single screen by the preparatory read processing of the fourth embodiment is represented as denoted by formula (11) given below:

$$Tp4 = Tdelay \times (2n - 1) \quad (11)$$
$$= (Treset + Tprch + Tread) \times (2n - 1)$$

Incidentally, where it suffices for the charge accumulating period Ta to cover n×Tdelay as in the third embodiment, it suffices to perform the reading operation to cover half the single screen (n/2 rows). It follows that the time required for the reading is Tp4' as denoted by formula (12) given below:

$$Tp4' = Tdelay \times (3n/2 - 1) \quad (12)$$
$$= (Treset + Tprch + Tread) \times (3n/2 - 1)$$

In the drive control method of the fourth embodiment, the charge accumulating period Ta is changed at a time interval twice the second pulse interval Tdelay. Therefore, it is impossible to adjust the charge accumulating period Ta finely with the second pulse interval Tdelay as in the third embodiment. However, the charge accumulating period can be set at a value twice as long as the charge accumulating period in the third embodiment by the preparatory read processing over the entire single screen. For example, in the case of using the sensor array 100 having 256 rows, the sensitivity can be adjusted up to 512 stages, making it possible to obtain an image by the set value of the sensitivity over a range broader than that in the third embodiment. Also, in the drive control method according to the fourth embodiment, the reset pulses are successively applied at the second pulse interval Tdelay for each row. Thus, the reset pulse supplied from the top gate driver is supplied only to a single photosensor at a time. It follows that the fourth embodiment produces the merit that a large drive capacity need not be provided as in the third embodiment.

As described above, in the drive control method according to the fourth embodiment, it is possible to obtain the results of detection for many kinds of sensitivities corresponding to the number of rows over a sensitivity range broader than that in the third embodiment by reading a single screen only once even in the case of using a top gate driver having a small drive capacity, making it possible to obtain more information required for the sensitivity adjustment. Naturally, the drive circuit can be diminished, and it is possible to obtain a value of an optimum detection sensitivity corresponding to the changes over a wide range in the environmental conditions and in the subject to be detected.

Incidentally, since it is necessary to change the applying order of signal pulses from the first line toward the n-line in the reset operation and from the n-th line toward the first line in the read operation, it is necessary for the shift register of the bottom gate driver 112 to be provided with a function for switching the shift direction.

Also, in the embodiment described above, the reset pulse, read pulse and pre-charge pulse for each row are applied at a time interval of Tdelay. However, it is possible to set the time interval at a value an integer number times as long as the interval Tdelay. It is also possible to apply these pulses for each row at a time interval an integer number times as long as the interval Tdelay, not at a constant pulse applying interval for each row.

<Fifth Embodiment>

FIGS. 6A to 6N are timing charts showing the timings of the processing operation for each row according to a fifth embodiment of the drive control method for a photosensor system of the present invention. The fifth embodiment is directed to the drive control method in the preparatory read processing like the third and fourth embodiments.

In the drive control method for the preparatory read processing according to the fifth embodiment, the reset pulses φT1, φT2, . . . φTn/2, φTn/2+1, . . . φTn−1, and φTn are successively applied to the double gate type photosensors 10 through the top gate line 101 connecting the top gate terminals TG in the row direction, starting with the first row and proceeding toward the n-th row at the second pulse interval Tdelay shown in formula (5) so as to start the reset period Treset and, thus, to initialize the double gate type photosensors 10 for each row. When the reset period Treset is terminated, the charge accumulating period Ta is started, with the result that charge (hole) is accumulated in the channel region in accordance with the amount of light incident from the side of the top gate electrode of the double gate type photosensors for each row.

Also, during the reset pulse application, the read pulses φBn, φBn−1, . . . φBn/2+1, φBn/2, . . . φB2, and φB1 shown in FIGS. 6L to 6G are successively applied to each row of the bottom gate lines 102 at the second pulse interval Tdelay, starting with the n-th row and proceeding toward the first row. Also, the pre-charge pulse φpg shown in FIG. 6M is successively applied in accordance with the read pulses φBn/2, . . . φB2, φB1 at n/2nd row et seq. at the second pulse interval Tdelay so as to execute the read operation.

After the reset pulse φTn at the lowermost row falls down to the lower level and after lapse of the second pulse interval Tdelay, the pre-charge pulse φpg corresponding to the read pulse is applied again successively at the second pulse interval Tdelay, starting with the lowermost row (n-th row) and proceeding toward the n/2+1st row and, at the same time, the read pulses φBn, φBn−1, . . . φBn/2+1 are successively applied so as to execute the read operation.

In this fashion, the changes in voltages VD1, VDm shown in FIG. 6N and conforming with the charge accumulated during the charge accumulating period Ta set for each row are taken into the column switch 113 through the data line 103 so as to be read out.

The charge accumulating period Ta for each row in the fifth embodiment is represented as denoted by formula (13), covering the first row to n12nd row:

$$Ta = 2Tdelay \times K + Tprch \quad (13)$$

Ta for the n/2+1st row to the n-th row is represented as denoted by formula (14):

$$Ta = Tdelay \times K + Tprch \quad (14)$$

where K is a variable consisting of an integer of 0 or more. The value of K is n−2, n−4, . . . 0 for the first row to the n/2nd row, and n−1, n−3, . . . 3, 1 for the n/2+1st row to the n-th row. To be more specific, the change in the value of K for rows is not continuous but is intermittent with a single integer interposed between adjacent values of K. However, the value of K is changed step by step in n-stages from 0 to n−1 as a whole. It follows that the charge accumulating period Ta assumes n-kinds of different values at a time interval an integer number times as long as the second pulse interval Tdelay by the read operation of a single screen so as to execute the read processing with n-kinds of different sensitivities.

The time Tp5 required for the reading of a single screen is represented as denoted by formula (15) in the preparatory read processing in the fifth embodiment.

$$Tp5 = Tdelay \times (3n/2 + 1) \qquad (15)$$
$$= (Treset + Tprch + Tread) \times (3n/2 + 1)$$

It follows that, according to the drive control method according to the fifth embodiment of the present invention, the charge accumulating period is changed between adjacent rows at a time interval twice the second pulse interval Tdelay as in the fourth embodiment. However, it is possible to obtain an image with the same range and the same set interval as in the third embodiment when it comes to the entire single screen. Also, in the drive control method according to the fifth embodiment, the reset pulses are successively applied to the rows at the second pulse interval Tdelay, leading to the merit that the top gate driver need not be provided with a large drive capacity as in the third embodiment.

According to the drive control method of the fifth embodiment, it is possible to obtain the result of detection with many kinds of sensitivities corresponding to the number of rows with the same fineness as in the third embodiment by simply reading once a single screen. As a result, it is possible to diminish the drive circuit and to obtain appropriate values of detected sensitivities conforming with the changes in the environmental conditions and in the subject to be detected.

Incidentally, the applying order of the signal pulses are changed from the first row to the n-row in the reset operation and from the n-th row to the first row in the read operation, making it necessary for the shift register of the bottom gate driver 112 to be provided with a switching function of the shift direction.

In the embodiments described above, the applying interval of the read pulses and the pre-charge pulses for each row is set at Tdelay. However, it is also possible to set the applying interval at a value an integer number times as long as Tdelay. Also, it is possible for the applying interval for each row not to be constant. In other words, the applying interval may be made different from row to row at a value an integer number times as long as Tdelay.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A drive control method for a photosensor array including a plurality of rows, each having a plurality of photosensors arranged to form a matrix, the method comprising a driving sequence which includes:
    applying a reset pulse to a predetermined row of the photosensor array to initialize the plurality of photosensors in the row;
    accumulating charges generated by light irradiation during a charge accumulation period;
    applying a predetermined pre-charge pulse to the plurality of photosensors during a pre-charge operation; and
    applying a read pulse to the plurality of photosensors of the row after completion of the initialization, after the charge accumulating period, and after the pre-charge operation, to output a voltage generated by the charges accumulated during the charge accumulating period as an output voltage;
    wherein timings of applying the reset pulse, the pre-charge pulse and the read pulse to each row are set not to overlap in time with each other,
    wherein the charge accumulating periods for the rows are set to have a period equal to one of: (i) a sum of a read pulse interval for each row and a pulse width of the pre-charge pulse, and (ii) a sum of an integer multiple of a read pulse interval and the pulse width of the pre-charge pulse, and
    wherein the charge accumulating periods have an overlapping period between at least two different rows.

2. The drive control method for a photosensor system according to claim 1, wherein the reset pulses are successively applied to the rows of the photosensor array to successively initialize the plurality of photosensors, and wherein the read pulses are successively applied to the plurality of photosensors after the initialization, after the charge accumulating period and after completion of the pre-charge operation, to output successively the voltages generated by the charges accumulated during the charge accumulating period as the output voltages.

3. The drive control method for a photosensor system according to claim 2, wherein an application period of the pre-charge pulse and the read pulse for each row is equal to or longer than a sum of a pulse width of the pre-charge pulse and a pulse width of the read pulse.

4. The drive control method for a photosensor system according to claim 2, wherein an application period of the reset pulse for each row and an application period of the pre-charge pulse and the read pulse for each row are equal to or longer than a sum of a pulse width of the pre-charge pulse and a pulse width of the read pulse.

5. The drive control method for a photosensor system according to claim 2, wherein an application period of the reset pulse for each row and an application period of the pre-charge pulse and the read pulse for each row are equal to or longer than a sum of a pulse width of the reset pulse, a pulse width of the pre-charge pulse and a pulse width of the read pulse.

6. The drive control method for a photosensor system according to claim 1, wherein each of the photosensors comprises a source electrode and a drain electrode arranged with a channel region comprising a semiconductor layer interposed therebetween, and a first electrode and a second electrode formed at least above and below the channel region with insulating layers interposed therebetween, and wherein the charges are generated and accumulated in an amount corresponding to an amount of light irradiating the channel region.

7. The drive control method for a photosensor system according to claim 6, wherein the reset pulse is applied to the first electrode of the photosensor to initialize the photosensor; and the pre-charge pulse is applied to the drain electrode of the photosensor, and the read pulse is applied to the second electrode of the photosensor after completion of the pre-charge operation to output a voltage of the drain electrode as the output voltage.

8. The drive control method for a photosensor system according to claim 1, wherein an application period of the pre-charge pulse for each row and the read pulse is equal to or an integer number times as long as a sum of a pulse width of the pre-charge pulse and a pulse width of the read pulse.

9. The drive control method for a photosensor system according to claim 8, wherein the charge accumulating periods for the rows are equal to or an integer number times as long as said sum and are set different from each other depending on the rows.

10. The drive control method for a photosensor system according to claim 8, wherein the reset pulses are simultaneously applied to the rows of the photosensor array, the pre-charge pulses are applied at the time interval equal to or an integer number times as long as said sum, and the read pulses are applied to each row, and wherein the charge accumulating period for each row is set to a different time.

11. The drive control method for a photosensor system according to claim 8, wherein the reset pulses are applied to each row of the photosensor array at the time interval equal to or an integer number times as long as said sum and, after completion of the reset pulse application to all the rows, the pre-charge pulses are applied and the read pulses are applied to each row in an order opposite to an order of applying the reset pulses to each row of the photosensor array.

12. The drive control method for a photosensor system according to claim 8, wherein the reset pulses are successively applied to each row of the photosensor array at the time interval equal to or an integer number times as long as said sum;

wherein the pre-charge pulses are applied in synchronism with the application of the reset charges, and the read pulses are applied to each row in an order opposite to an order of applying the reset pulses to each row of the photosensor array; and wherein after completion of a pre-charge voltage application and the read pulse application, and after a lapse of time equal to said sum, the pre-charge pulses are applied and the read pulse is applied again to each row in an order equal to the order of applying the read pulse to each row at the time interval equal to or an integer number times as long as said sum.

* * * * *